(12) United States Patent
Arai (10) Patent No.: US 9,136,835 B2
(45) Date of Patent: Sep. 15, 2015

(54) SWITCH CIRCUIT (71) Applicant: Kabushiki Kaisha Toshiba, Minato-ku, Tokyo (JP)

(72) Inventor: Makoto Arai, Tachikawa (JP)

(73) Assignee: Kabushiki Kaisha Toshiba, Minato-ku, Tokyo (JP)

(*) Notice: Subject to any disclaimer, the term of this patent is extended or adjusted under 35 U.S.C. 154(b) by 0 days.

(21) Appl. No.: 14/192,375

(22) Filed: Feb. 27, 2014

(65) Prior Publication Data

US 2015/0054569 A1   Feb. 26, 2015

(30) Foreign Application Priority Data

Aug. 22, 2013   (JP) ................. 2013-172129

(51) Int. Cl.
*H03K 17/16*   (2006.01)
(52) U.S. Cl.
CPC ................... *H03K 17/164* (2013.01)
(58) Field of Classification Search
CPC .......... H03K 17/04123; H03K 17/063; H03K 17/164; H03K 17/687; H03K 17/0822; H03K 2217/0036

USPC ......... 327/387, 389, 391, 427, 434, 437, 534; 326/113

See application file for complete search history.

(56) References Cited

U.S. PATENT DOCUMENTS

| 5,332,916 A | 7/1994 | Hirai | |
| 7,554,382 B2 * | 6/2009 | Miske et al. | 327/382 |
| 2008/0231341 A1 * | 9/2008 | Miske | 327/427 |

FOREIGN PATENT DOCUMENTS

| JP | 59-028723 A | 2/1984 |
| JP | 05-95266 A | 4/1993 |
| JP | 2000-077992 A | 3/2000 |

* cited by examiner

*Primary Examiner* — John Poos
*Assistant Examiner* — David Mattison
(74) *Attorney, Agent, or Firm* — White & Case LLP (57) ABSTRACT According to one embodiment, a switch circuit includes a transmission unit configured to transmit a signal through a transistor, in which a back gate and a source are connected by way of a resistor; and a back gate control unit configured to connect the back gate of the transistor to a fixed potential when the transistor is turned OFF, and to separate the back gate of the transistor from the fixed potential when the transistor is turned ON.

13 Claims, 5 Drawing Sheets

SWITCH CIRCUIT

CROSS-REFERENCE TO RELATED APPLICATIONS

This application is based upon and claims the benefit of priority from Japanese Patent Application No. 2013-172129, filed on Aug. 22, 2013; the entire contents of which are incorporated herein by reference.

FIELD

Embodiments described herein relate generally to a switch circuit.

BACKGROUND

In a switch circuit, when on-resistance of a transistor is lowered to ensure operation even when a power supply voltage is lowered, it is difficult to ensure the isolation property of when the transistor is turned OFF.

DETAILED DESCRIPTION

In general, according to one embodiment, a transmission unit and a back gate control unit are arranged. The transmission unit transmits a signal through a transistor in which a back gate and a source are connected by way of a resistor. The back gate control unit connects the back gate of the transistor to a fixed potential when the transistor is turned OFF, and separates the back gate of the transistor from the fixed potential when the transistor is turned ON.

A switch circuit according to embodiments will be described in detail below with reference to the accompanying drawings. The present invention is not limited by the embodiments.

First Embodiment

Figure 1:
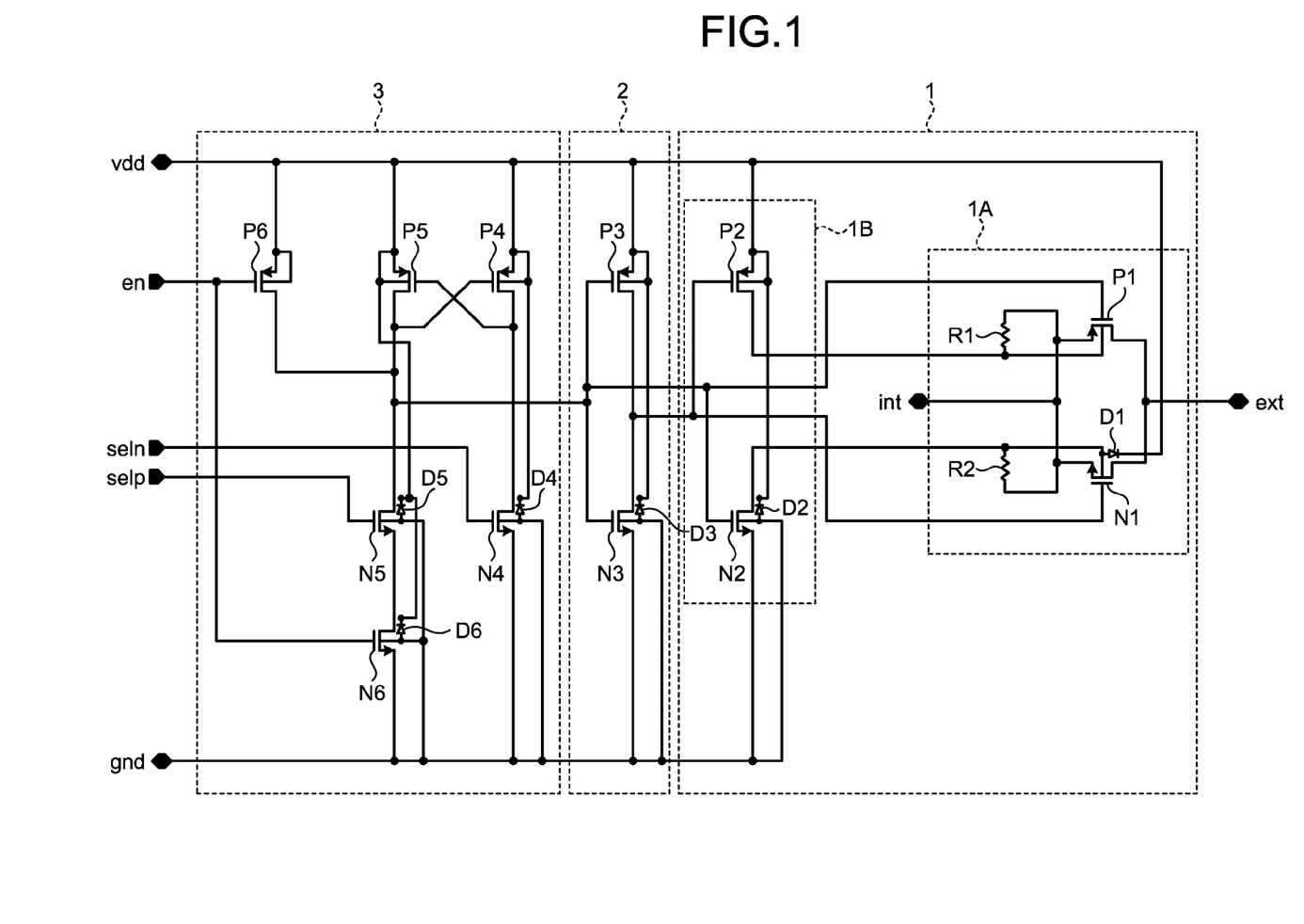
FIG. 1 is a circuit diagram illustrating a schematic configuration of a switch circuit according to a first embodiment.

FIG. 1 is a circuit diagram illustrating a schematic configuration of a switch circuit according to a first embodiment.

In FIG. 1, the switch circuit 1 includes a transmission unit 1A and a back gate control unit 1B. An inverter 2 is connected to a pre-stage of the switch circuit 1, and a level shifter 3 is connected to a pre-stage of the inverter 2.

The transmission unit 1A includes a P-channel transistor P1, an N-channel transistor N1, and resistors R1, R2. The back gate control unit 1B includes a P-channel transistor P2 and an N-channel transistor N2. The inverter 2 includes a P-channel transistor P3 and an N-channel transistor N3. The level shifter 3 includes P-channel transistors P4 to P6 and N-channel transistors N4 to N6.

The P-channel transistor P1 is connected in parallel with the N-channel transistor N1. The resistor R1 is connected between the back gate and the source of the P-channel transistor P1. The resistor R2 is connected between the back gate and the source of the N-channel transistor N1. The back gate of the P-channel transistor P1 is connected to a power supply potential vdd through the P-channel transistor P2, and the back gate of the N-channel transistor N1 is connected to a ground potential gnd through the N-channel transistor N2. An input signal int is input to the source of the P-channel transistor P1 and the source of the N-channel transistor N1, and an output signal ext is output from the drain of the P-channel transistor P1 and the drain of the N-channel transistor N1.

The P-channel transistor P3 is connected in series with the N-channel transistor N3. The P-channel transistor P3 and the N-channel transistor N3 have the gates commonly connected to each other. The gate of the P-channel transistor P3 is connected to the gate of the P-channel transistor P1, and the drain of the P-channel transistor P3 is connected to the gate of the N-channel transistor N1. The gate of the P-channel transistor P1 is connected to the gate of the N-channel transistor N2. The gate of the N-channel transistor N1 is connected to the gate of the P-channel transistor P2.

The P-channel transistor P4 is connected in series with the N-channel transistor N4. The P-channel transistor P5 is connected in series with the N-channel transistor N5, and the N-channel transistor N5 is connected in series with the N-channel transistor N6. The P-channel transistor P6 is connected in parallel with the P-channel transistor P5. The gate of the P-channel transistor P4 is connected to the drain of the P-channel transistor P5, and the gate of the P-channel transistor P5 is connected to the drain of the P-channel transistor P4. A control signal seln is input to the gate of the N-channel transistor N4, and a control signal selp is input to the gate of the N-channel transistor N5. The control signal seln is a signal obtained by inverting the control signal selp. The control signals seln, selp can be generated based on a different power supply from the power supply potential vdd. An enable signal en is input to the gate of the P-channel transistor P6 and the gate of the N-channel transistor N6.

The sources of the P-channel transistors P2 to P6 are connected to the power supply potential vdd, and the sources of the N-channel transistors N2 to N4, N6 are connected to the ground potential gnd. The back gates of the P-channel transistors P2 to P6 are connected to the power supply potential vdd, and the back gates of the N-channel transistors N2 to N6 are connected to the ground potential gnd. The back gates of the N-channel transistors N1 to N6 are connected to the power supply potential vdd through diodes D1 to D6.

When the enable signal en becomes high level, the P-channel transistor P6 is turned OFF and the N-channel transistor N6 is turned ON. In this case, when the control signal selp becomes high level and the control signal seln becomes low level, the N-channel transistor N5 is turned ON and the N-channel transistor N4 is turned OFF. Thus, the drain of the P-channel transistor P5 is set to the ground potential gnd and the P-channel transistor P4 is turned ON, so that the drain of the P-channel transistor P4 is set to the power supply potential vdd and the P-channel transistor P5 is turned OFF.

When the drain of the P-channel transistor P5 is set to the ground potential gnd, the gate potential of the P-channel transistor P1 becomes low level, and the P-channel transistor P1 is turned ON. Additionally the drain potential of the P-channel transistor P5 is inverted by the inverter 2, then the gate potential of the N-channel transistor N1 becomes high level, and the N-channel transistor N1 is turned ON. Thus, the input signal int input to the source of the P-channel transistor P1 and the source of the N-channel transistor N1 is output as the output signal ext from the drain of the P-channel transistor P1 and the drain of the N-channel transistor N1.

When, the drain of the P-channel transistor P5 is set to the ground potential gnd, the gate potential of the N-channel transistor N2 becomes low level, and the N-channel transistor N2 is turned OFF. Additionally the drain potential of the P-channel transistor P5 is inverted by the inverter 2, then the gate potential of the P-channel transistor P2 becomes high level, and the P-channel transistor P2 is turned OFF. Thus, the back gate of the P-channel transistor P1 is separated from the power supply potential vdd, and the back gate of the N-channel transistor N1 is separated from the ground potential gnd. As a result, the back gate of the P-channel transistor P1 becomes the same potential as the source of the P-channel transistor P1, and the back gate of the N-channel transistor N1 becomes the same potential as the source of the N-channel transistor N1. Therefore, the on-resistance of the N-channel transistor N1 and the P-channel transistor P1 are lowered, then the input signal int can be transmitted even when the source/gate voltages of the N-channel transistor N1 and the P-channel transistor P1 are lowered accompanying the lowering of the power supply potential vdd.

When the control signal selp becomes low level and the control signal seln becomes high level and the enable signal en is high level, the N-channel transistor N5 is turned OFF and the N-channel transistor N4 is turned ON. Thus, the drain of the P-channel transistor P4 is set to the ground potential gnd and the P-channel transistor P5 is turned ON, whereby the drain of the P-channel transistor P5 is set to the power supply potential vdd and the P-channel transistor P4 is turned OFF.

When the drain of the P-channel transistor P5 is set to the power supply potential vdd, the gate potential of the P-channel transistor P1 becomes high level, and the P-channel transistor P1 is turned OFF. Additionally the drain potential of the P-channel transistor P5 is inverted by the inverter 2, then the gate potential of the N-channel transistor N1 becomes low level, and the N-channel transistor N1 is turned OFF. Thus, the input signal int input to the source of the P-channel transistor P1 and the source of the N-channel transistor N1 is not output as the output signal ext from the drain of the P-channel transistor P1 and the drain of the N-channel transistor N1.

When the drain of the P-channel transistor P5 is set to the power supply potential vdd, the gate potential of the N-channel transistor N2 becomes high level, and the N-channel transistor N2 is turned ON. Additionally the drain potential of the P-channel transistor P5 is inverted by the inverter 2, then the gate potential of the P-channel transistor P2 becomes low level, and the P-channel transistor P2 is turned ON. Thus, the back gate of the P-channel transistor P1 is connected to the power supply potential vdd, and the back gate of the N-channel transistor N1 is connected to the ground potential gnd. As a result, the potentials of the back gates of the N-channel transistor N1 and the P-channel transistor P1 are fixed, and the isolation property of when the N-channel transistor N1 and the P-channel transistor P1 are turned OFF enhances.

Furthermore, when the enable signal en becomes low level, the P-channel transistor P6 is turned ON and the N-channel transistor N6 is turned OFF. Thus, the drain of the P-channel transistor P5 is set to the power supply potential vdd.

When the drain of the P-channel transistor P5 is set to the power supply potential vdd, the gate potential of the P-channel transistor P1 becomes high level, and the P-channel transistor P1 is turned OFF. Additionally the drain potential of the P-channel transistor P5 is inverted by the inverter 2, then the gate potential of the N-channel transistor N1 becomes low level, and the N-channel transistor N1 is turned OFF. Thus, the input signal int input to the source of the P-channel transistor P1 and the source of the N-channel transistor N1 is not output as the output signal ext from the drain of the P-channel transistor P1 and the drain of the N-channel transistor N1.

When the drain of the P-channel transistor P5 is set to the power supply potential vdd, the gate potential of the N-channel transistor N2 becomes high level, and the N-channel transistor N2 is turned ON. Additionally the drain potential of the P-channel transistor P5 is inverted by the inverter 2, then the gate potential of the P-channel transistor P2 becomes low level, and the P-channel transistor P2 is turned ON. Thus, the back gate of the P-channel transistor P1 is connected to the power supply potential vdd, and the back gate of the N-channel transistor N1 is connected to the ground potential gnd. As a result, the potential of the back gates of the N-channel transistor N1 and the P-channel transistor P1 are fixed, and the isolation property of when the N-channel transistor N1 and the P-channel transistor P1 are turned OFF enhances.

For example, the amplitudes of the control signals selp, seln can be set to 1.5 V, and the power supply potential vdd can be set to 3 V. The level shifter 3 converts the amplitudes of the control signals selp, seln to the level of the power supply potential vdd, and drives the inverter 2 at the amplitude of the power supply potential vdd.

Figure 2:
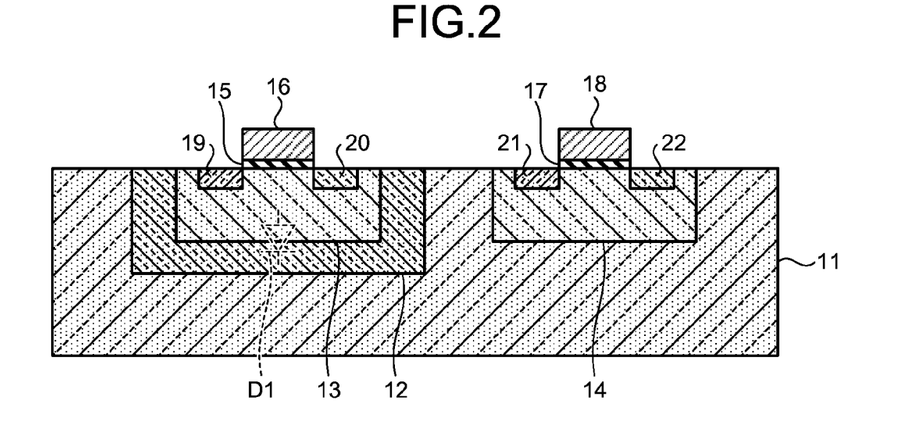
FIG. 2 is a cross-sectional view illustrating a schematic configuration of a transistor used in the switch circuit of FIG. 1.

FIG. 2 is a cross-sectional view illustrating a schematic configuration of a transistor used in the switch circuit of FIG. 1.

In FIG. 2, N-wells 12, 14 are formed in a P-type semiconductor substrate 11, and a P-well 13 is formed in the N-well 12. A gate electrode 16 is formed on the P-well 13 by way of a gate insulating film 15. N-type impurity diffusion layers 19, 20 are formed in the P-well 13 so as to sandwich a channel layer formed under the gate electrode 16. The N-type impurity diffusion layers 19, 20 can configure the source/drain of the N-channel transistor N1. The P-well 13 can configure the back gate of the N-channel transistor N1. A diode D1 is formed at a joining portion of the N-well 12 and the P-well 13.

A gate electrode 18 is formed on the N-well 14 by way of a gate insulating film 17. P-type impurity diffusion layers 21, 22 are formed in the N-well 14 so as to sandwich a channel layer formed under the gate electrode 18. The P-type impurity diffusion layers 21, 22 can configure the source/drain of the P-channel transistor P1. The N-well 14 can configure the back gate of the P-channel transistor P1.

Figure 3A:
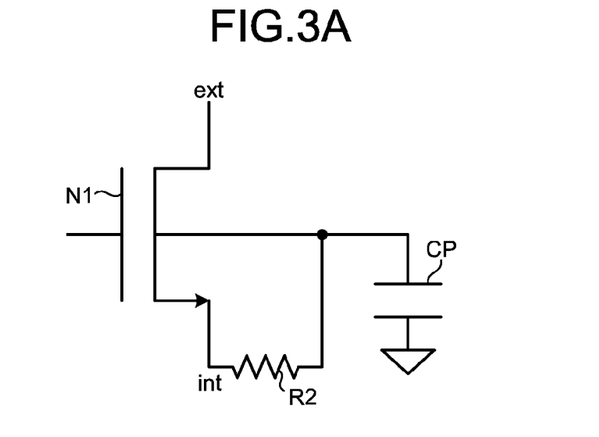
FIG. 3A is a circuit diagram illustrating a connection state of when a transistor used in the switch circuit of FIG. 1 is turned ON, and FIG. 3B is a circuit diagram illustrating a connection state of when the transistor used in the switch circuit of FIG. 1 is turned OFF.
Figure 3B:
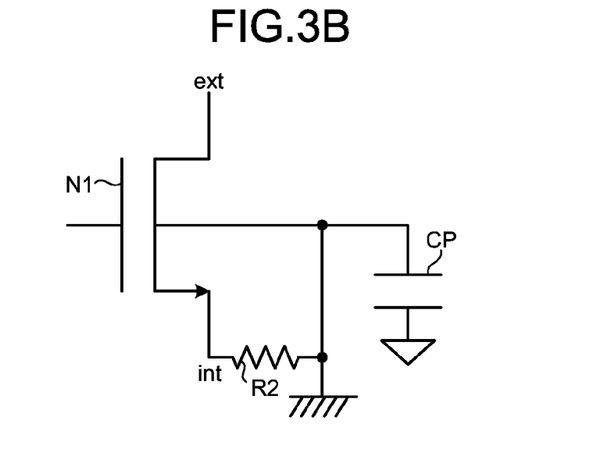

FIG. 3A is a circuit diagram illustrating a connection state of when a transistor used in the switch circuit of FIG. 1 is turned ON, and FIG. 3B is a circuit diagram illustrating a connection state of when the transistor used in the switch circuit of FIG. 1 is turned OFF.

In FIG. 3A, when the N-channel transistor N1 is turned ON, the back gate of the N-channel transistor N1 is separated from the ground potential gnd with the back gate of the N-channel transistor N1 connected to the source by way of the resistor R2. As a result, the back gate of the N-channel transistor N1 and the source of the N-channel transistor N1 become the same potential. Therefore, the on-resistance of the N-channel transistor N1 is lowered, then the input signal int can be output as the output signal ext from the drain of the N-channel transistor N1 even when and the source/gate voltage of the N-channel transistor N1 is lowered accompanying the lowering of the power supply potential vdd.

A parasitic capacitance CP of the diode D1 is added to the back gate of the N-channel transistor N1. In this case, the value of the resistor R2 is preferably set so that the parasitic capacitance CP can be ignored on the transmission path of the input signal int. Thus, the input signal int can be suppressed from leaking through the parasitic capacitance CP, and the input signal int can be efficiently output as the output signal ext from the drain of the N-channel transistor N1.

In FIG. 3B, when the N-channel transistor N1 is turned OFF, the back gate of the N-channel transistor N1 is connected to the ground potential gnd with the back gate of the N-channel transistor N1 connected to the source by way of the resistor R2. As a result, the potential of the back gate of the N-channel transistor N1 is fixed, and the isolation property of when the N-channel transistor N1 is turned OFF enhances.

Second Embodiment

Figure 4:
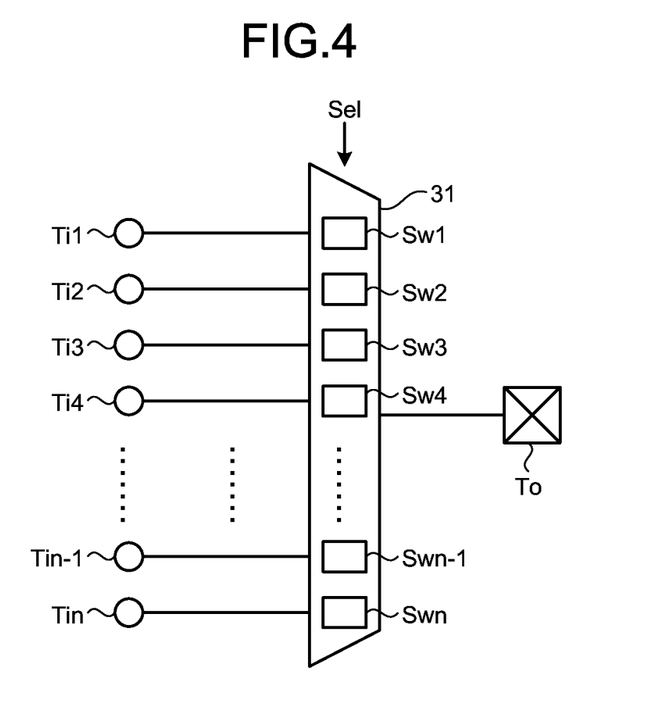
FIG. 4 is a block diagram illustrating a schematic configuration of a selector applied with a switch circuit according to a second embodiment.

FIG. 4 is a block diagram illustrating a schematic configuration of a selector applied with a switch circuit according to a second embodiment.

In FIG. 4, a selector 31 includes n (n is a positive integer) switch circuits Sw1 to Swn. Each switch circuit Sw1 to Swn can use the switch circuit 1 of FIG. 1. The selector 31 also includes n input terminals Ti1 to Tin in correspondence with the switch circuits Sw1 to Swn, and one output terminal To is arranged common to all the switch circuits Sw1 to Swn. One of the n switch circuits Sw1 to Swn is turned ON and the other switch circuits are turned OFF based on the control signal Sel. The output terminal To can be used with a pad electrode formed on the semiconductor chip.

The input signal int input from the input terminal is output from the output terminal To as the output signal ext through the switch circuit turned ON. The n input terminals Ti1 to Tin can be shared with one output terminal To by arranging the n switch circuits Sw1 to Swn in the selector 31, whereby the space of the output terminal To can be reduced. For example, the pad electrodes on the semiconductor chip corresponding to the output terminal To can be reduced, and the number of pins of the semiconductor package corresponding to the output terminal To can be reduced.

Third Embodiment

Figure 5:
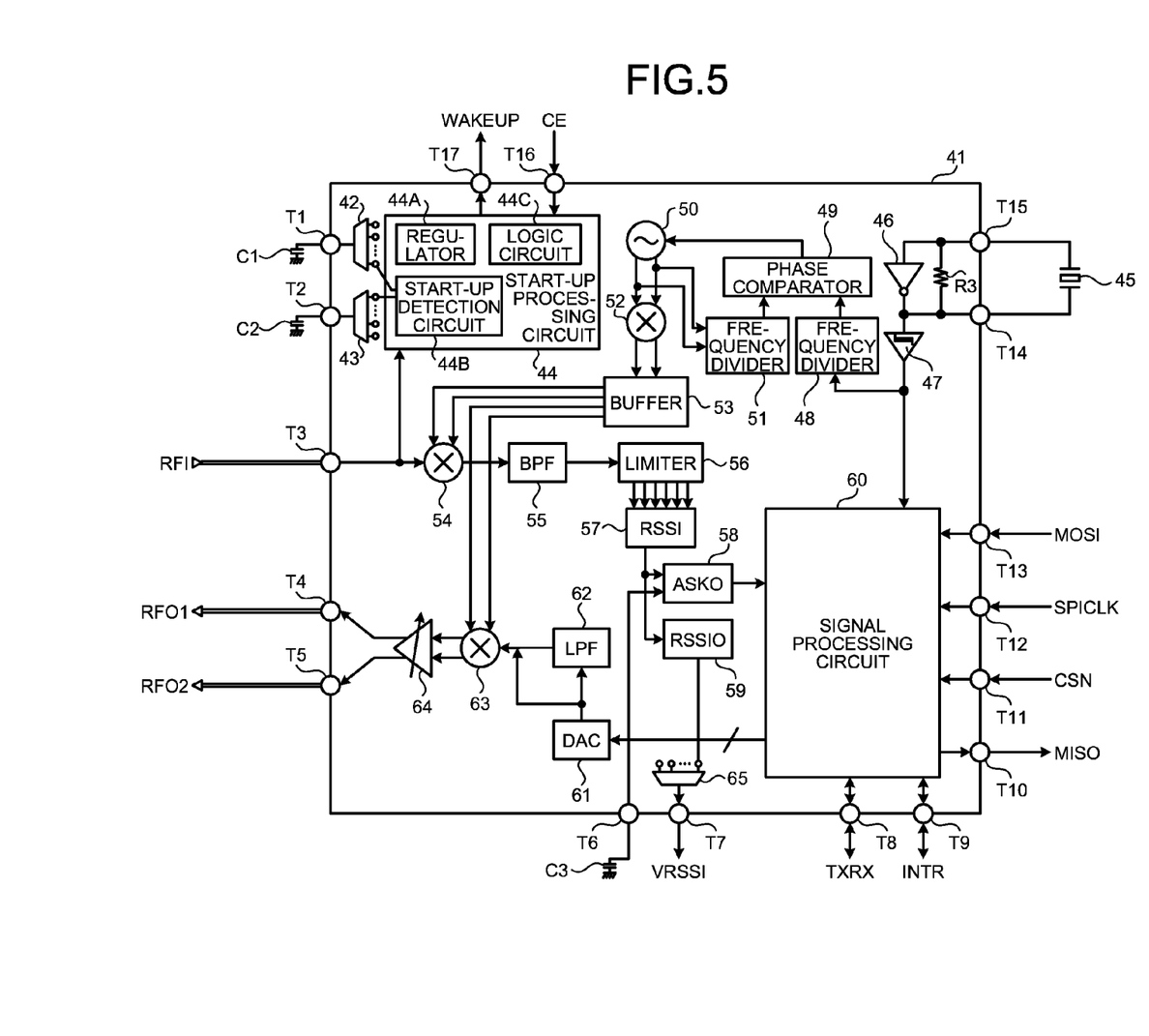
FIG. 5 is a block diagram illustrating a schematic configuration of an integrated circuit applied with a switch circuit according to a third embodiment.

FIG. 5 is a block diagram illustrating a schematic configuration of an integrated circuit applied with a switch circuit according to a third embodiment. In the third embodiment, a case in which an integrated circuit used in an ETC (Electronic Toll Collection System) is formed on a semiconductor chip 41 is illustrated by way of example. The semiconductor chip 41 can be operated with a dry battery at a low voltage of about 3 V.

In FIG. 5, the semiconductor chip 41 includes terminals T1 to T17, a resistor R3, selectors 42, 43, 65, a start-up processing circuit 44, an inverter 46, a waveform converter 47, frequency dividers 48, 51, a phase comparator 49, a voltage control oscillator 50, a multiplier 52, mixers 54, 63, a buffer 53, a band pass filter 55, a limiter 56, an intensity measurement unit 57, a level comparator 58, an intensity output unit 59, a signal processing circuit 60, a DA converter 61, a low pass filter 62, and an amplifier 64. The start-up processing circuit 44 includes a regulator 44A, a start-up detection circuit 44B, and a logic circuit 44C. Each selector 42, 43, 65 can use the selector 31 of FIG. 4.

The output terminal of the selector 42 is connected to the terminal T1, the output terminal of the selector 43 is connected to the terminal T2, and the output terminal of the selector 65 is connected to the terminal T7. A capacitance C1 is externally attached to the terminal T1, and a capacitance C2 is externally attached to the terminal T2. One input terminal of the selector 42 is connected to a first DC feedback capacitance addition terminal of the start-up detection circuit 44B, and one input terminal of the selector 43 is connected to a second DC feedback capacitance addition terminal of the start-up detection circuit 44B. Other input terminals of the selectors 42, 43 can be used as test terminals of the semiconductor chip 41, and can be connected to each block of the semiconductor chip 41. One input terminal of the selector 65 is connected to the output terminal of the intensity output unit 59.

The terminal T3 is connected to the input terminals of the mixer 54 and the start-up processing circuit 44. The terminals T4, T5 are connected to the output terminal of the amplifier 64. The terminal T6 is connected to a reference terminal of the level comparator 58. A capacitance C3 is externally attached to the terminal T6. The terminal T7 is connected to the output terminal of the intensity output unit 59. The terminal T8 is connected to a transmission/reception switching terminal of the signal processing circuit 60. The terminal T9 is connected to an interruption terminal of the signal processing circuit 60. The terminal T10 is connected to a master input terminal of the signal processing circuit 60. The terminal T11 is connected to a slave selection terminal of the signal processing circuit 60. The terminal T12 is connected to a clock terminal of the signal processing circuit 60. The terminal T13 is connected to a master output terminal of the signal processing circuit 60. The terminal T14 is connected to an output terminal of the inverter 46. The terminal T15 is connected to an input terminal of the inverter 46. The resistor R3 is connected in parallel with the inverter 46. A crystal oscillator 45 is externally attached between the terminals T14, T15. The terminal T16 is connected to an enable terminal of the start-up processing circuit 44. The terminal T17 is connected to an output terminal of the start-up processing circuit 44.

When approaching the gate with the semiconductor chip 41 mounted on the vehicle, and the like, a wireless input signal RFI is input to the start-up detection circuit 44B and the mixer 54 through the terminal T3. A power supply voltage stabilized by a regulator 44A is supplied to the start-up detection circuit 44B and the logic circuit 44C.

When a start-up instruction is detected from the wireless input signal RFI in the start-up detection circuit 44B, a start-up signal WAKEUP is generated in the start-up processing circuit 44, and output to the outside through the terminal T17. A microcomputer can be connected to the exterior of the terminal T17. When the start-up signal WAKEUP is input to the microcomputer, the microcomputer is started, and an enable signal CE is input from the microcomputer to the start-up processing circuit 44 through the terminal T16.

A sine wave is output from the inverter 46 when the crystal oscillator 45 is oscillated, which sine wave is converted to a rectangular wave in the waveform converter 47 and output to the frequency divider 48 and the signal processing circuit 60. The output of the waveform converter 47 is frequency divided by the frequency divider 48, and then output to the phase comparator 49. Furthermore, the signal from the voltage control oscillator 50 is frequency divided by the frequency divider 51, and then output to the phase comparator 49. In the voltage control oscillator 50, the outputs of the frequency dividers 48, 51 are compared with each other, and the frequency of the voltage control oscillator 50 is controlled such that the phase coincides with the outputs of the frequency dividers 48, 51 with respect to each other. The signal from the voltage control oscillator 50 is multiplied by the multiplier 52, and then output to the mixers 54, 63 through the buffer 53.

The wireless input signal RFI input through the terminal T3 is mixed with the output of the multiplier 52 in the mixer 54, so that the wireless input signal RFI is down converted and output to the limiter 56 through the band pass filter 55. After the amplitude of the wireless input signal RFI is limited by the limiter 56, the intensity of the wireless input signal RFI is measured by the intensity measurement unit 57. An intensity measurement value VRSSI of the wireless input signal RFI is held in the intensity output unit 59, and then output through the terminal T7.

The intensity measurement value VRSSI of the wireless input signal RFI is compared with the reference level in the level comparator 58, and then converted to a digital value based on the comparison result and input to the signal processing circuit 60. At this time, the signal processing circuit 60 operates as a slave, and can perform signal processing while communicating with the master. A slave selection signal CSN is output from the master, so that the master can communicate with the slave selected with the slave selection signal CSN. The selected slave can receive a master input signal MOSI from the master through the terminal T13 or transmit a master output signal MISO to the master through the terminal T10 while receiving a clock signal SPICLK through the terminal T12. The signal processing circuit 60 can transmit/receive a transmission/reception switching signal TXRX through the terminal T8, and can transmit/receive an interruption signal INTR through the terminal T9.

A transmission signal generated by the signal processing circuit 60 is converted to an analog signal by the DA converter 61, and output to the mixer 63 through the low pass filter 62. The signal is mixed with the output of the multiplier 52 in the mixer 63, so that the transmission signal is up converted, and then amplified by the amplifier 64 and output through the terminals T4, T5.

The selectors 42, 43, 65 are connected to the terminals T1, T2, T7, respectively, so that the test terminals do not need to be formed on the semiconductor chip 41 separate from the terminals T1, T2, T7, and the semiconductor chip 41 can be miniaturized. Furthermore, the on-resistance of the transistors of the switch circuit 1 can be reduced, and the start-up processing circuit 44 and the intensity output unit 59 can be operated normally while responding to lower voltage of the semiconductor chip 41 by arranging the switch circuit 1 of FIG. 1 in the selectors 42, 43, 65.

Figure 6:
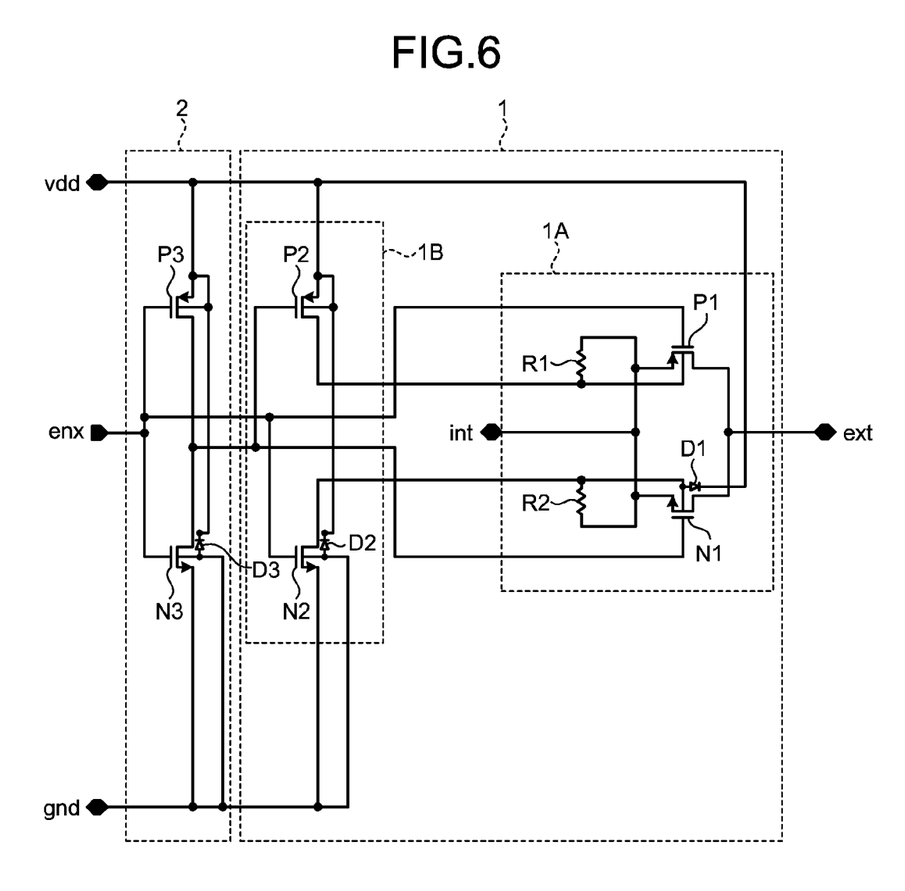
FIG. 6 is a block diagram illustrating a schematic configuration of an integrated circuit applied with a switch circuit according to a fourth embodiment.

FIG. 6 is a block diagram illustrating a schematic configuration of an integrated circuit applied with a switch circuit according to a fourth embodiment.

In FIG. 6, the level shifter 3 of FIG. 1 is omitted in the switch circuit, and an enable signal enx is input to the inverter 2.

When the enable signal enx becomes low level, the gate potential of the P-channel transistor P1 becomes low level and the P-channel transistor P1 is turned ON. Additionally the enable signal enx is inverted by the inverter 2, then the gate potential of the N-channel transistor N1 becomes high level and the N-channel transistor N1 is turned ON. Thus, the input signal int input to the source of the P-channel transistor P1 and the source of the N-channel transistor N1 is output as the output signal ext from the drain of the P-channel transistor P1 and the drain of the N-channel transistor N1.

When the enable signal enx becomes low level, the gate potential of the N-channel transistor N2 becomes low level and the N-channel transistor N2 is turned OFF. Additionally the enable signal enx is inverted by the inverter 2, then the gate potential of the P-channel transistor P2 becomes high level and the P-channel transistor P2 is turned OFF. Thus, the back gate of the P-channel transistor P1 is separated from the power supply potential vdd, and the back gate of the N-channel transistor N1 is separated from the ground potential gnd. As a result, the back gate of the P-channel transistor P1 becomes the same potential as the source of the P-channel transistor P1, and the back gate of the N-channel transistor N1 becomes the same potential as the source of the N-channel transistor N1. Therefore, the on-resistance of the N-channel transistor N1 and the P-channel transistor P1 are lowered, then the input signal int can be transmitted even when the source/gate voltages of the N-channel transistor N1 and the P-channel transistor P1 are lowered accompanying the lowering of the power supply potential vdd.

On the other hand, when the enable signal enx becomes high level, the gate potential of the P-channel transistor P1 becomes high level and the P-channel transistor P1 is turned OFF. Additionally the enable signal enx is inverted by the inverter 2, then the gate potential of the N-channel transistor N1 becomes low level and the N-channel transistor N1 is turned OFF. Thus, the input signal int input to the source of the P-channel transistor P1 and the source of the N-channel transistor N1 is not output as the output signal ext from the drain of the P-channel transistor P1 and the drain of the N-channel transistor N1.

When the enable signal enx becomes high level, the gate potential of the N-channel transistor N2 becomes high level and the N-channel transistor N2 is turned ON. Additionally the enable signal enx is inverted by the inverter 2, then the gate potential of the P-channel transistor P2 becomes low level and the P-channel transistor P2 is turned ON. Thus, the back gate of the P-channel transistor P1 is connected to the power supply potential vdd, and the back gate of the N-channel transistor N1 is connected to the ground potential gnd. As a result, the potentials of the back gates of the N-channel transistor N1 and the P-channel transistor P1 are fixed, and the isolation property of when the N-channel transistor N1 and the P-channel transistor P1 are turned OFF enhances.

In the embodiments described above, the configuration in which the input signal int is input to the source of the P-channel transistor P1 and the source of the N-channel transistor N1, and the output signal ext is output from the drain of the P-channel transistor P1 and the drain of the N-channel transistor N1 has been described. As other embodiments, the input signal int may be input to the drain of the P-channel transistor P1 and the drain of the N-channel transistor N1, and the output signal ext may be output from the source of the P-channel transistor P1 and the source of the N-channel transistor N1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A switch circuit comprising:
    a transmission unit configured to transmit a signal through a single transistor, in which a back gate and a source are connected by way of a resistor; and a back gate control unit configured to connect the back gate of the single transistor to a fixed potential when the single transistor is turned OFF, and to separate the back gate of the single transistor from the fixed potential when the single transistor is turned ON, wherein the source of the single transistor is connected to an input terminal of the transmission unit, and the drain of the single transistor is connected to an output terminal of the transmission unit, wherein a value of the resistor is set so that a parasitic capacitance of the back gate is ignorable on a transmission path of the signal, wherein the transmission unit includes
  a first P-channel transistor,
  a first N-channel transistor connected in parallel with the first P-channel transistor,
  a first resistor connected between a back gate and a source of the first P-channel transistor, and
a second resistor connected between a back gate and a source of the first N-channel transistor, and
the back gate control unit includes
  a second P-channel transistor configured to connect the back gate of the first P-channel transistor to a first fixed potential based on an enable signal, and
  a second N-channel transistor configured to connect the back gate of the first N-channel transistor to a second fixed potential based on the enable signal,
wherein the source of the first P-channel transistor and the source of the first N-channel transistor are connected to an input terminal of the transmission unit, and the drain of the first P-channel transistor and the drain of the first N-channel transistor are connected to an output terminal of the transmission unit, and
wherein the enable signal is input to the gate of the first P-channel transistor and the gate of the second N-channel transistor; and a signal, in which the enable signal is inverted, is input to the gate of the second P-channel transistor and the gate of the first N-channel transistor, and further comprising an inverter configured to invert the enable signal, and a level shifter, arranged at a pre-stage of the inverter and configured to convert amplitude of a control signal that controls the back gate control unit.

2. The switch circuit according to claim 1, wherein the back gate and the source of the single transistor are set to the same potential when the single transistor is turned ON.

3. The switch circuit according to claim 1, wherein the second P-channel transistor is connected between the back gate of the first P-channel transistor and a power supply potential, and the second N-channel transistor is connected between the back gate of the first N-channel transistor and a ground potential.

4. The switch circuit according to claim 1, wherein the first P-channel transistor is formed in a first N-well arranged in a P-type semiconductor substrate, and the first N-channel transistor is formed in a P-well formed in a second N-well arranged in the P-type semiconductor substrate.

5. The switch circuit according to claim 4, wherein the first N-well configures the back gate of the first P-channel transistor, and the P-well configures the back gate of the first N-channel transistor.

6. The switch circuit according to claim 1, wherein a value of the second resistor is set so that a parasitic capacitance of the back gate of the first N-channel transistor is ignorable.

7. A switch circuit comprising:
a transmission unit configured to transmit a signal through a single transistor, in which a back gate and a source are connected by way of a resistor; and
a back gate control unit configured to connect the back gate of the single transistor to a fixed potential when the single transistor is turned OFF, and to separate the back gate of the single transistor from the fixed potential when the single transistor is turned ON, wherein the source of the single transistor is connected to an input terminal of the transmission unit, and the drain of the single transistor is connected to an output terminal of the transmission unit,
wherein a value of the resistor is set so that a parasitic capacitance of the back gate is ignorable on a transmission path of the signal,
wherein the transmission unit includes
  a first P-channel transistor,
  a first N-channel transistor connected in parallel with the first P-channel transistor,
  a first resistor connected between a back gate and a source of the first P-channel transistor, and
  a second resistor connected between a back gate and a source of the first N-channel transistor, and
the back gate control unit includes
  a second P-channel transistor configured to connect the back gate of the first P-channel transistor to a first fixed potential based on an enable signal, and
  a second N-channel transistor configured to connect the back gate of the first N-channel transistor to a second fixed potential based on the enable signal, being mounted for every input terminal in a selector, in which one output terminal is arranged with respect to n input terminals.

8. The switch circuit according to claim 7, wherein the selector is mounted on a semiconductor chip formed with an integrated circuit used for ETC.

9. The switch circuit according to claim 8, wherein an output terminal of the selector is connected to a terminal of the semiconductor chip.

10. The switch circuit according to claim 9, wherein the output terminal of the selector is a pad electrode of the semiconductor chip.

11. The switch circuit according to claim 9, wherein the integrated circuit includes a start-up processing circuit configured to input a start-up signal to a microcomputer based on a start-up instruction from a wireless input signal, and one input terminal of the selector is connected to the start-up processing circuit.

12. The switch circuit according to claim 1, wherein the back gate and the source of the first P-channel transistor are set to the same potential when the first P-channel transistor is turned ON, and the back gate and the source of the first N-channel transistor are set to the same potential when the first N-channel transistor is turned ON.

13. The switch circuit according to claim 1, wherein the back gate of the first P-channel transistor is set to a power supply potential when the first P-channel transistor is turned OFF, and the back gate of the first N-channel transistor is set to a ground potential when the first N-channel transistor is turned OFF.

* * * * *